United States Patent
Parsons et al.

(10) Patent No.: US 10,515,526 B2
(45) Date of Patent: Dec. 24, 2019

(54) SENSOR FOR AN ELECTRIC FENCE BARRIER SYSTEM

(71) Applicant: NEMTEK HOLDINGS (PTY) LTD, Randburg (ZA)

(72) Inventors: Shaun Anthony Parsons, Randburg (ZA); Leslie Sean Hurly, East London (ZA)

(73) Assignee: NEMTEK HOLDINGS (PTY) LTD, Northriding (ZA)

( * ) Notice: Subject to any disclaimer, the term of this patent is extended or adjusted under 35 U.S.C. 154(b) by 45 days.

(21) Appl. No.: 15/314,507

(22) PCT Filed: Oct. 26, 2015

(86) PCT No.: PCT/IB2015/058232
§ 371 (c)(1),
(2) Date: Nov. 28, 2016

(87) PCT Pub. No.: WO2016/067176
PCT Pub. Date: May 6, 2016

(65) Prior Publication Data
US 2018/0247499 A1 Aug. 30, 2018

(30) Foreign Application Priority Data
Oct. 27, 2014 (ZA) .................................. 14/07830

(51) Int. Cl.
*G08B 13/02* (2006.01)
*G08B 13/22* (2006.01)
*G08B 25/00* (2006.01)
*G08B 13/12* (2006.01)
*G01B 7/16* (2006.01)
*G01R 19/12* (2006.01)
(Continued)

(52) U.S. Cl.
CPC ............ *G08B 13/122* (2013.01); *A01K 3/005* (2013.01); *G01B 7/18* (2013.01); *G01R 19/12* (2013.01); *G08B 13/26* (2013.01); *G08B 25/00* (2013.01)

(58) Field of Classification Search
CPC ..................................................... G08B 13/122
USPC ......................................................... 340/561
See application file for complete search history.

(56) References Cited

U.S. PATENT DOCUMENTS

| | | | |
|---|---|---|---|
| 5,592,149 A * | 1/1997 | Alizi .................... | G08B 13/124 250/227.14 |
| 6,456,198 B1 * | 9/2002 | Kato ..................... | G08B 13/26 256/10 |

(Continued)

*Primary Examiner* — Santiago Garcia
(74) *Attorney, Agent, or Firm* — Jonathan M. D'Silva; MMI Intellectual Property

(57) ABSTRACT

A sensor for an electric fence barrier system comprising at least one electric fence wire is provided, the sensor comprising a mechanical sensing component to measure deflection of the electric fence wire to which the sensor has been fitted, and to produce a corresponding electrical deflection signal, an electrical activity monitoring component to measure the electrical activity on the electric fence wire to which the sensor has been fitted, and to produce an electrical activity signal, and a controller to receive and process the electrical deflection signal and the electrical activity signal, and to generate an alarm if either or both of the measured deflection or the electric activity exceeds predetermined values, and/or to communicate the electrical deflection and electrical activity signals to a remote location.

15 Claims, 5 Drawing Sheets

(51) Int. Cl.
 *G08B 13/26* (2006.01)
 *A01K 3/00* (2006.01)

(56) References Cited

U.S. PATENT DOCUMENTS

| | | | | |
|---|---|---|---|---|
| 9,000,918 | B1* | 4/2015 | McLaughlin | G08B 13/12 340/540 |
| 2008/0186172 | A1* | 8/2008 | Thompson | H05C 3/00 340/541 |
| 2011/0102178 | A1* | 5/2011 | Kalo | G08B 13/122 340/541 |
| 2013/0152681 | A1* | 6/2013 | Ben-Hamozeg | G08B 13/122 73/493 |
| 2013/0187784 | A1* | 7/2013 | Malins | E04H 17/10 340/668 |
| 2013/0247661 | A1* | 9/2013 | Ben-Hamozeg | G08B 13/02 73/493 |
| 2013/0304415 | A1* | 11/2013 | Bomparet | G08B 13/12 702/150 |
| 2016/0040375 | A1* | 2/2016 | Van Kasteren | E01F 11/00 404/6 |

* cited by examiner

SENSOR FOR AN ELECTRIC FENCE BARRIER SYSTEM

FIELD OF INVENTION

This invention relates to the field of electric fence barrier systems, and in particular it relates to a sensor for an electric fence barrier system for detecting and localizing a break in an electric fence and/or a sufficient change in wire tension in one or more of the wires of the electric fence and/or any tampering, for example, to bypass the fence. This invention can also be used to detect and localize areas of the fence that require maintenance due to heavy vegetation causing significant energy loss from the fence.

BACKGROUND OF INVENTION

Electric fence barrier systems are well known in the industry for, amongst other applications, preventing unauthorised entry into a protected zone (or to retain animals within a confined area).

With reference to FIG. 1, an electric fence typically comprises a fence energizer to generate high-voltage electrical pulses which are propagated down one or more conducting wires of the electric fence. In FIG. 1, four live wires are shown that are looped or connected together at their ends, namely Live Wire A, Live Wire B, Live Wire C and Live Wire D, with an Earth Wire also being provided. When a person or animal touches a conducting wire, a path to ground is created through the person/animal. The electrical potential (and possibly current) is monitored to detect if/when an electrical fault occurs. The electrical potential is typically raised to a level that is extremely painful to touch, so as to provide a very cost effective physical deterrent with alarm capabilities.

Advantageously, electric fences, unlike conventional fences, do not need to be strong enough to withstand an attempt to push through the fence. This advantage allows electric fences to be designed and constructed more simply than conventional fences. As a result, less material may be required and less maintenance may need to be performed than would be required for a conventional fence. This may often result in a significant cost savings over conventional fences. Thus, electric fences are favored by many landowners and have become increasingly popular. It may, however, not be desirable to excite a fence at a high voltage all the time i.e. a school playground.

If an electric fence breaks or is cut, a significant portion of the length of the fence may be de-electrified. This renders the entire de-electrified portion of electric fence virtually useless. Thus, an electric fence must be monitored closely and a fence break must be repaired as soon as possible.

The most straightforward method of monitoring an electric fence is to manually inspect the electric fence on a regular basis to verify that it is in working order. However, many electric fences are installed over rough terrain or over-grown areas which make it difficult to access portions of the fence for inspection. Moreover, the length of electric fences may extend thousands of metres, making the process of inspecting each point on such a fence exceedingly time-consuming. Thus, a need exists for a monitoring system which automatically alerts a user to a failure in an electric fence without requiring him to perform a manual inspection of the fence.

It is accordingly desirable to know the location of the damaged or failed section of the electric fence, to facilitate remedial action. A number of methods have been implemented to address this, including:

1. Mounting mechanical sensors on the fence, such as, vibration sensors, strain gauges on posts, taut-wire sensors, accelerometer sensors and other sensing devices along the perimeter and monitoring these sensors via a communication network.
2. Using multiple energizers to partition the perimeter covered by the electric fence into discrete electrical zones.
3. Using voltage (and/or current) sensing devices to monitor the electrical activity on the fence. If the voltage reading falls out of a specified range or the current reading falls rapidly, the sensing devices trigger an alarm.
4. In the case of optical fibers, using time domain reflectrometry (TDR) to locate where the optical properties of an optical fiber have changed due to deflection. TDR can, however, be used to locate short and open circuits on electric fence wires too, but TDR is technically challenging and typically requires expensive electronics to implement.
5. Using microphonic cable, infra-red beams, closed circuit television and microwave sensors, or any combination of these solutions, for monitoring and protecting the fence.

The primary disadvantage of the above techniques is that they are discrete technologies and are often unable to complement each other naturally. Some of these solutions can also be financially very costly to implement, for example TDR. Each of the above technologies has certain advantages and disadvantages. For example, a fence with vibration sensors alone may not be a deterrent to an intruder who does not understand that such a technology exists. Conversely, interacting with an electric fence can be a physically painful experience, and as such an electric fence can be a strong physical deterrent; however, the monitoring of electrical activity on the electric fence this does not take into account physical manipulation of the electric fence, for example, using an insulator (such as a wooden plank) to separate the wires of the fence, thereby enabling the intruder to climb through the fence. Also, for someone with a bit of knowledge, it is a relatively simple matter to bridge out a section of the fence electrically, and then cut the fence wires to gain entry through the fence without any alarm being raised.

A taut-wire system will now be described in more detail. In a taut-wire system, a taut-wire sensor is mounted on a post and clamped to a wire. Should the tension in the wire change, a deflection on the sensor occurs and an alarm is raised. In its simplest form, the taut-wire sensor can be a mechanical switch. More sophisticated taut-wire sensors utilise strain gauges and microprocessors implementing advanced processing algorithms, mounted in each sensor, which can compensate for gradual drift due to shifting corner posts, temperature effects, wind, or short duration deflection such as a soccer ball being kicked against the fence. False alarms can thus be drastically reduced by utilising such technology. As the strain gauges and electronics can be encapsulated in resin and a plastic housing, the harmful effects of lightning are far less significant.

An electric fence arrangement that includes the addition of taut-wire sensors results in a more secure barrier, but it still has shortcomings that need to be addressed. The present invention aims to provide a solution to address these shortcomings.

Thus, taut-wire sensors exist and are used for perimeter protection, and remote voltage and/or current sensors exist and have been used on electric fence barrier systems. The aim of the present invention is to combine these two technologies into a single sensor. The hardware and installation cost savings are significant

SUMMARY OF INVENTION

According to the invention there is provided a sensor for an electric fence barrier system comprising at least one electric fence wire, the sensor comprising:

- a mechanical sensing component to measure deflection of the electric fence wire to which the sensor has been fitted, and to produce a corresponding electrical deflection signal;
- an electrical activity monitoring component to measure the electrical activity on the electric fence wire to which the sensor has been fitted, and to produce an electrical activity signal; and
- a controller to receive and process the electrical deflection signal and the electrical activity signal, and to generate an alarm if either or both of the measured deflection or the electric activity exceeds predetermined values, and/or to communicate the electrical deflection and electrical activity signals to a remote location.

In an embodiment, the mechanical sensing component comprises a taut-wire sensor including a strain gauge sensor, an amplifier and a microprocessor to detect if an abnormal deflection of the electric fence wire has taken place.

In an embodiment, the electrical activity monitoring component comprises a device to measure the electrical potential of and/or current flow through the electric fence wire to which the sensor is attached, to detect any alteration of the electric fence circuit, resulting in different potentials along the fence circuit and/or current paths through the fence conductors.

In an embodiment, the electrical activity monitoring component is fitted proximate the connection point between the electric fence wire and the sensor, with the device to measure the electrical potential being implementable using any one of the following known methods: resistor divider, capacitive divider, and current measurement through a known resistor. Clearly, those skilled in the art will appreciate that this is a non-exhaustive list of very many possible ways of measuring electrical potential.

In an embodiment, the electrical activity monitoring component is fitted proximate the connection point between the electric fence wire and the sensor, with the device to measure the electrical current flowing in the wire being implementable using any one of the following known ways: voltage drop across a known resistor, current induced into the secondary winding of a current transformer, and using a Hall effect sensor. Again, those skilled in the art will appreciate that this is a non-exhaustive list of very many possible ways of measuring electrical current.

In an embodiment, the sensor is encapsulated within an insulator body that is arranged to support the electric fence wire, the insulator body being securable to a post of the electric fence barrier system.

In an embodiment, the sensor includes a communications module to transmit the alarm and/or other data to a remote station, typically using a wired arrangement or a wireless arrangement, and/or to receive requests or instructions from the remote station.

In an embodiment, each sensor has a unique identifier to enable the location of the alarm, or measured mechanical and electrical parameters at that sensor, to be made known.

BRIEF DESCRIPTION OF DRAWINGS

The invention will now be further described, by way of example, with reference to the accompanying diagrammatic drawings.

In the drawings.

DETAILED DESCRIPTION OF PREFERRED EMBODIMENT

Figure 1:
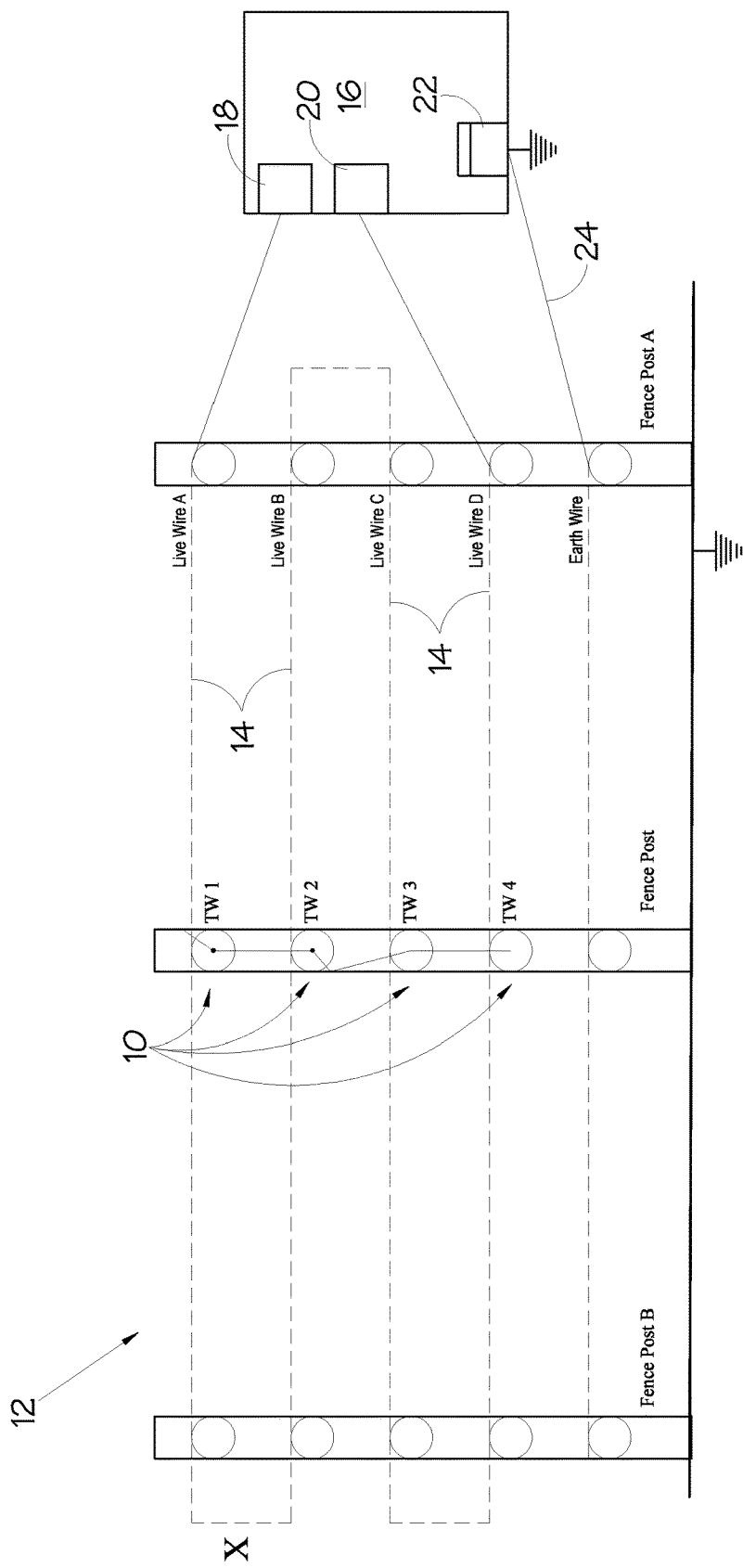
FIG. 1 shows a section of an electric fence barrier system using the taut-wire sensor of the present invention.

Referring to the figures, sensors 10 for an electric fence barrier system 12 is shown, the electric fence barrier system 12 comprising at least one electric fence wire 14, as is well known in the art. Typically, and as already described above, the electric fence barrier system 12 comprises a fence energizer 16 to generate high-voltage electrical pulses which are propagated down one or more conducting wires 14 of the electric fence 12. In FIG. 1, four live wires are shown that are looped or connected together at their ends, namely Live Wire A, Live Wire B, Live Wire C and Live Wire D, with an Earth Wire also being provided. The energizer 16 comprises a high voltage output 18 connected to, in this case, the Live Wire A, a high voltage return 20 connected to, in this case, the Live Wire D, and a ground return 22 connected to the Earth Wire via connecting wires 24. The energizer 16 further includes an alarm monitor, as is well known in the art.

Figure 2:
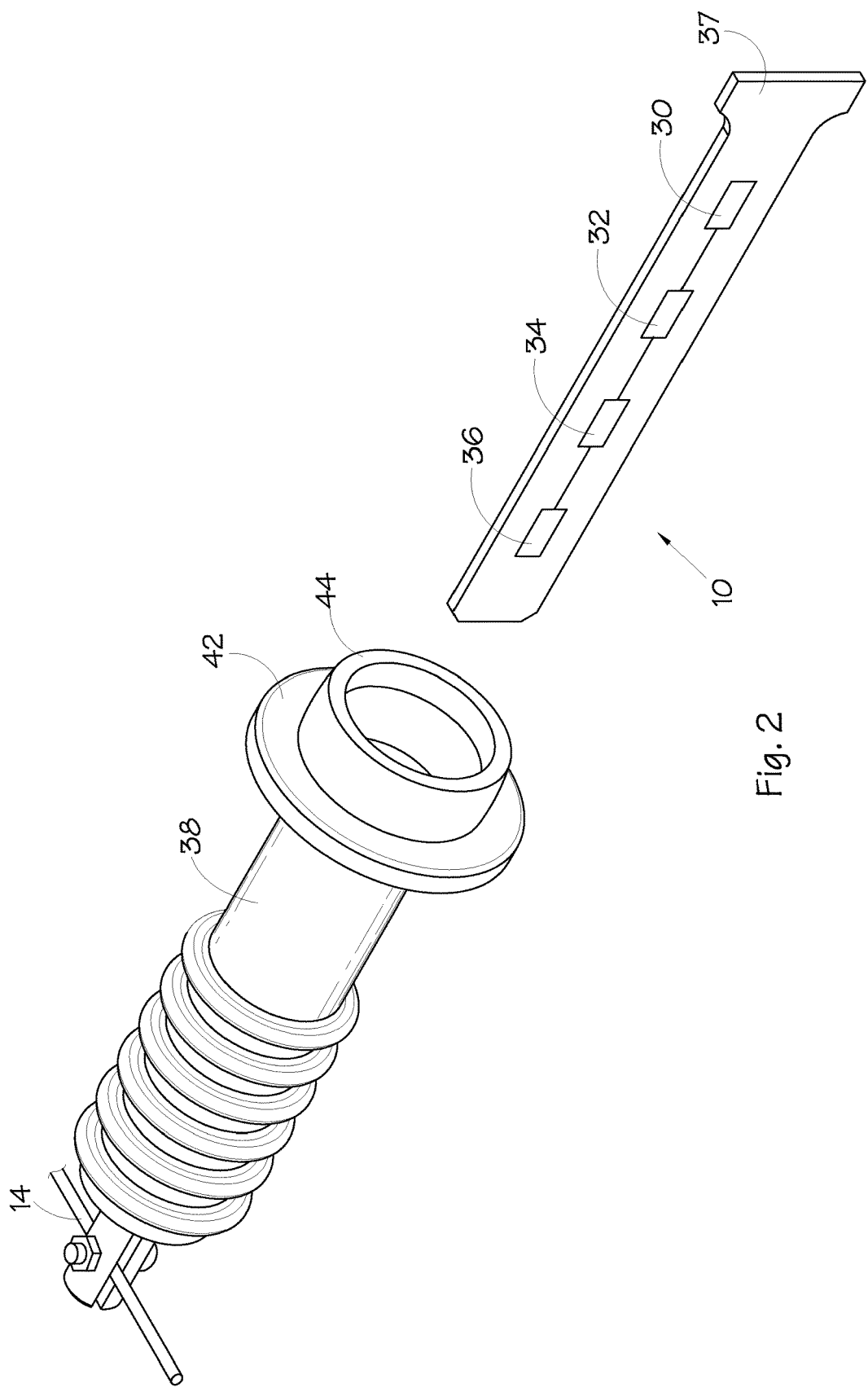
FIG. 2 shows a schematic detailed perspective view of the sensor used in FIG. 1, prior to encapsulation within an insulator body.
Figure 3:
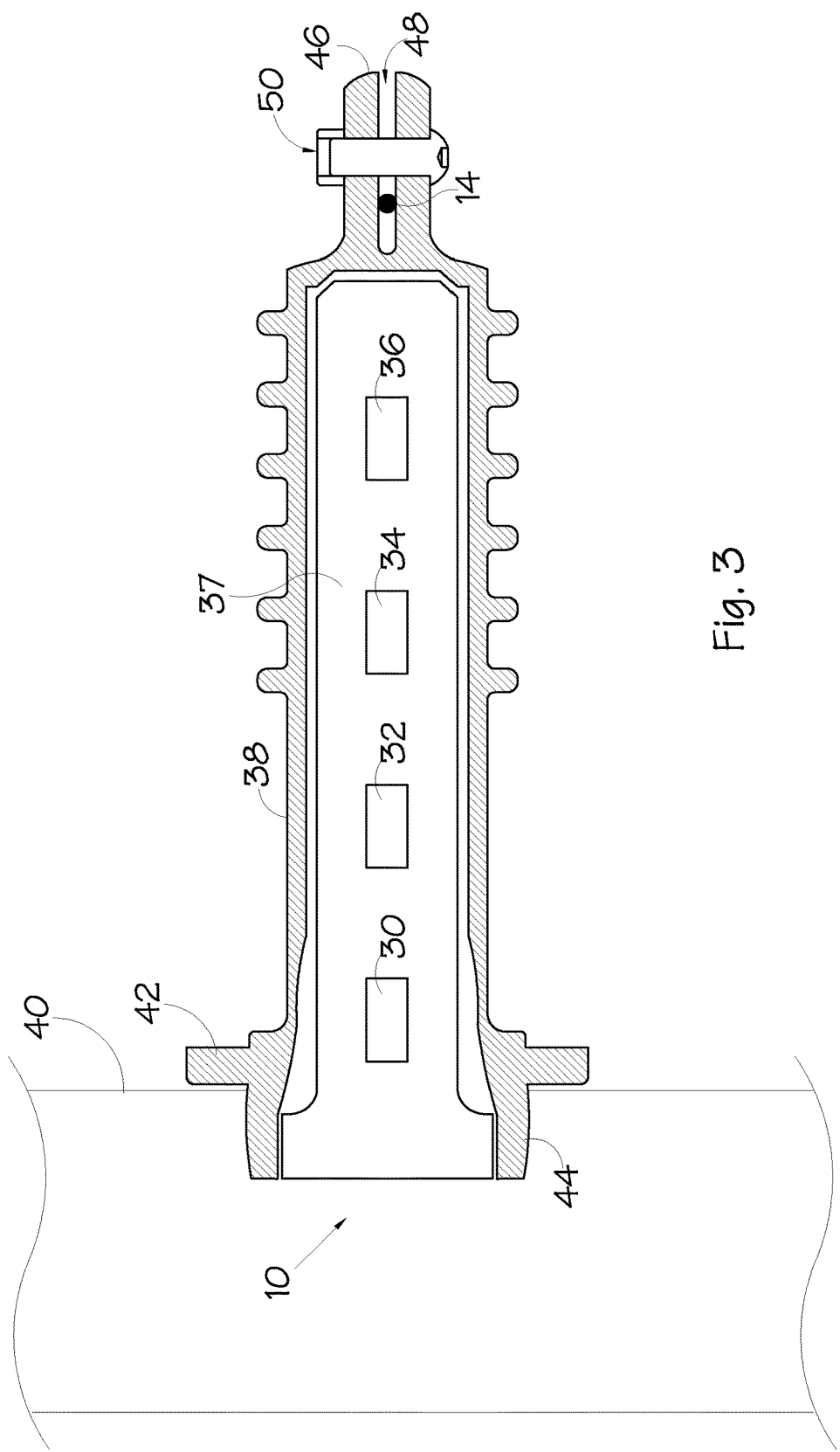
FIG. 3 shows a cross-sectional of the insulator body, with the sensor housed therein, in use fitted to fence post.

As best shown in FIGS. 2 and 3, the sensor 10 comprises an electromechanical sensing component 30 to measure deflection of the electric fence wire 14 to which the sensor 10 has been fitted, and to produce a corresponding proportional electrical deflection signal. In an embodiment, the mechanical sensing component 30 comprises a taut-wire sensor including a strain gauge sensor, an amplifier and a microprocessor to detect if an abnormal deflection of the electric fence wire 14 has taken place.

The sensor 10 further comprises an electrical activity monitoring component 32 to measure the electrical activity on the electric fence wire 14 to which the sensor 10 has been fitted, and to produce an electrical activity signal.

In the illustrated embodiment, the electrical activity monitoring component 32 comprises a device to measure the electrical potential and/or current flow through the electric fence wire 14 to which the sensor 10 is attached. The aim is to detect any alteration of the electric fence circuit, resulting in different potentials along the fence circuit and/or current paths through the fence wires 14.

In an embodiment, the electrical activity monitoring component 32 is fitted proximate the connection point between the electric fence wire 14 and the sensor 10, with the device to measure the electrical potential being implementable using any one of the following known methods: resistor divider, capacitive divider, and current measurement through a known resistor. Each method would have its advantages and disadvantages in the form of simplicity, cost, galvanic isolation etc. However, it is envisaged that a resistive divider arrangement may be the most practical method of implementing potential measurement.

In an embodiment, the electrical activity monitoring component 32 is fitted proximate the connection point between the electric fence wire 14 and the sensor 10, with the device to measure the electrical current flowing in the wire 14 being implementable using any one of the following known ways: voltage drop across a known resistor, and current induced into the secondary winding of a current transformer. However, this feature may be omitted if costs are to be contained. Again, each method would have its advantages and disadvantages in the form of simplicity, cost, galvanic isolation etc.

The sensor 10 further comprises a controller 34 to receive and process the mechanical deflection signal and the electrical activity signal, and to generate an alarm if either or both of the measured deflection or the electric activity exceeds predetermined values.

The present invention thus provides enhanced electrical monitoring capabilities of an electric fence 12, with as many discernible sectors as there are sensors, enabling far more precise fault and intrusion reporting with regard to position of the fault/intrusion on the fence 12. In this regard, each sensor 10 has a unique identifier to enable the location of the alarm to be made known.

This invention is not only limited to more accurate spatial fault/intrusion reporting along the electric fence 12, but will make available far more detailed information for enhanced fence control algorithms improving energy efficiency and fence effectiveness as well as detailed fence diagnostics and conditions.

In this regard, the sensor 10 includes a communications module 36 to transmit the alarm and/or other data to a remote station, typically using a wired arrangement, but a wireless arrangement could just as easily be used, and/or to receive requests or instructions from the remote station. In a domestic application, a wired arrangement may be better. A large game fence could also use a wired arrangement, as it may be more economical to construct the fence barrier system using RS485 cabling in a daisy chain arrangement, comprising 1 km daisy chained lengths with a 5 W photovoltaic panel every 1 km to power a local cluster of sensors and a RS485 node.

The components 30, 32, 34 and 36 may typically be mounted onto a printed circuit board (PCB) 37.

To demonstrate the invention, reference will now be made to FIG. 1. In an electric fence construction 12 that only uses taut-wire sensors, but no voltage/current monitoring, within the sensors 10:

1. A change in wire tension on one or more of the Wires A, B, C and D, between Fence Post A and Fence Post B, would cause an alarm condition, and could be identified, on the taut wire monitoring system due to a change in mechanical conditions.
2. However, a cut in the electrical conductor at point X would not cause an alarm on the taut wire system because the tension in the wire between Fence Post A and Fence Post B remains unaltered. Although an alarm would be detected and raised by the alarm of the energizer, the location of the fault would be unknown.

In an electric fence construction 12 using the taut-wire sensor 10 of the present invention (i.e. a sensor with voltage (and possibly current) monitoring built into the individual sensor:

1. The alarm conditions mentioned in 1 and 2 above would still apply.
2. A cut at point X would result in sensor TW 1 reporting a normal fence voltage but the sensors TW 2, TW 3 and TW 4 reporting a significantly reduced voltage. The fault location would be easily identified between the sensors, TW1 and TW2.
3. If the electric fence alarm monitor and taut wire sensors alarm monitor are combined, a number of additional advantages would ensue. Because the tension in Live Wire A and Live Wire B remained unaltered when the cut at X was made, it indicates the fault did not occur on Live Wire A or Live Wire B. However, the lack of voltage on sensor TW2 would indicate that the fault occurred between Live Wire A and Live Wire B, namely at X.
4. If current monitoring were to be incorporated as well, attempts to bypass certain sectors of the fence could similarly be detected.

Turning now to FIGS. 2 and 3, the sensor 10 is typically encapsulated within an insulator body 38 that is arranged to support the electric fence wire 14. The insulator body 38 can be secured to a fence post 40 of the electric fence barrier system, as best shown in FIG. 3. In this regard, the insulator body 38 may comprise a flange 42 at one end of the body 38, which can abut against the fence post 40. A stub portion 44 extends from the flange 42, which extends into the fence post 40. On the other end of the insulator body 38, a spaced apart pair of arms 46 defines a gap 48 for accommodating the fence wire 14. A clamping nut and bolt arrangement 50 is used to clamp the arms 46 together, thus securing the fence wire 14 in place.

In an example embodiment, the electromechanical sensing component of the taut-wire sensor is arranged to detect any movement of the sensor relative to the mounting post. Typically, an accelerometer and/or a strain gauge would be used to achieve this. The signals that are generated by the movement are conditioned electronically and converted to a digital value, as described above.

Figure 4:
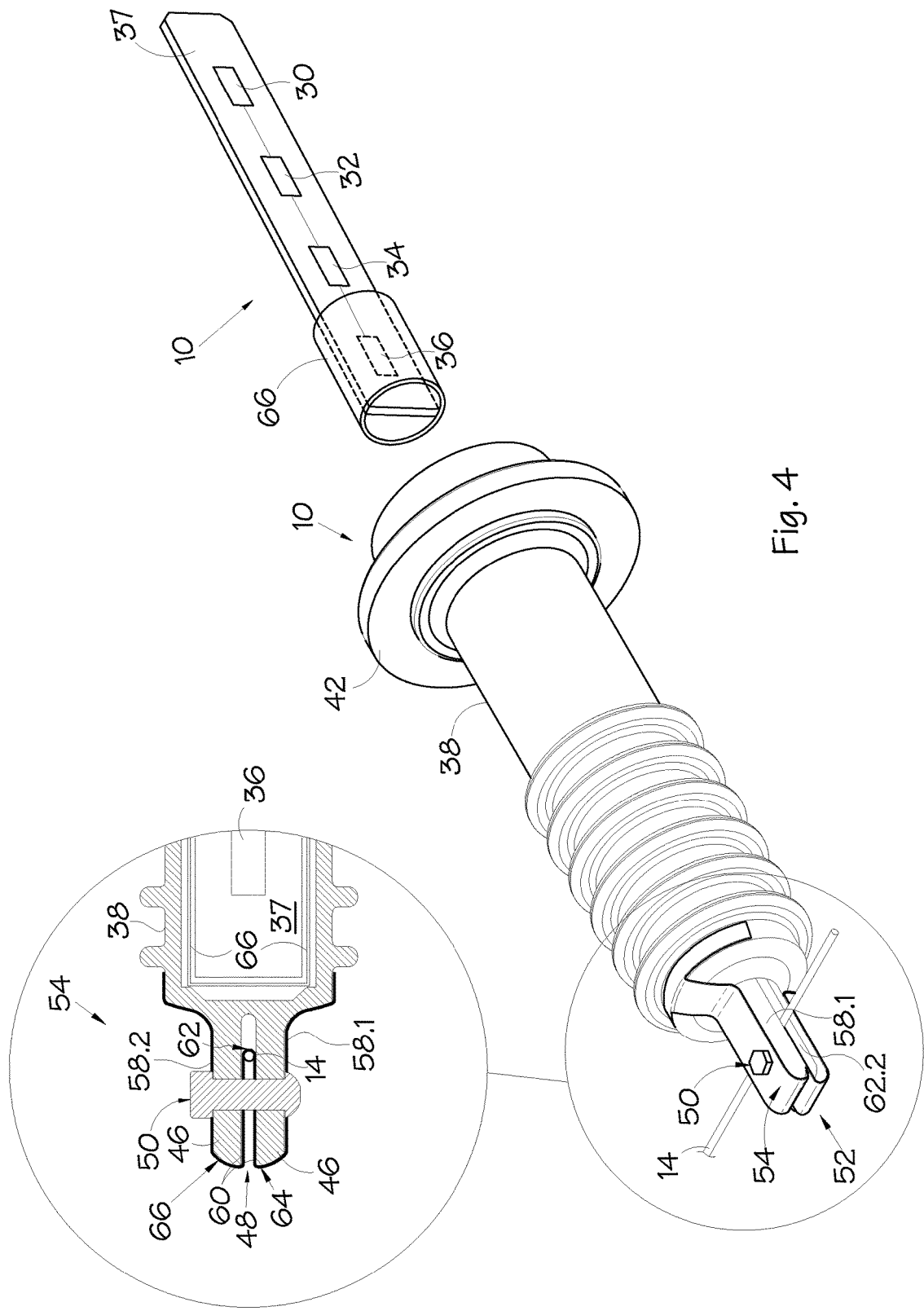
FIG. 4 shows a capacitive potential divider arrangement for measuring the electrical activity on the electric fence wire.

In an example embodiment, with particular reference to FIG. 4, the electrical activity monitoring component may make use of a capacitive potential divider arrangement 52 for measuring the electrical activity on the electric fence wire 14. In one version, a metal plate 54, typically made from brass, is fitted over the end of the insulator body 38, proximate the fence wire 14.

Figure 5:
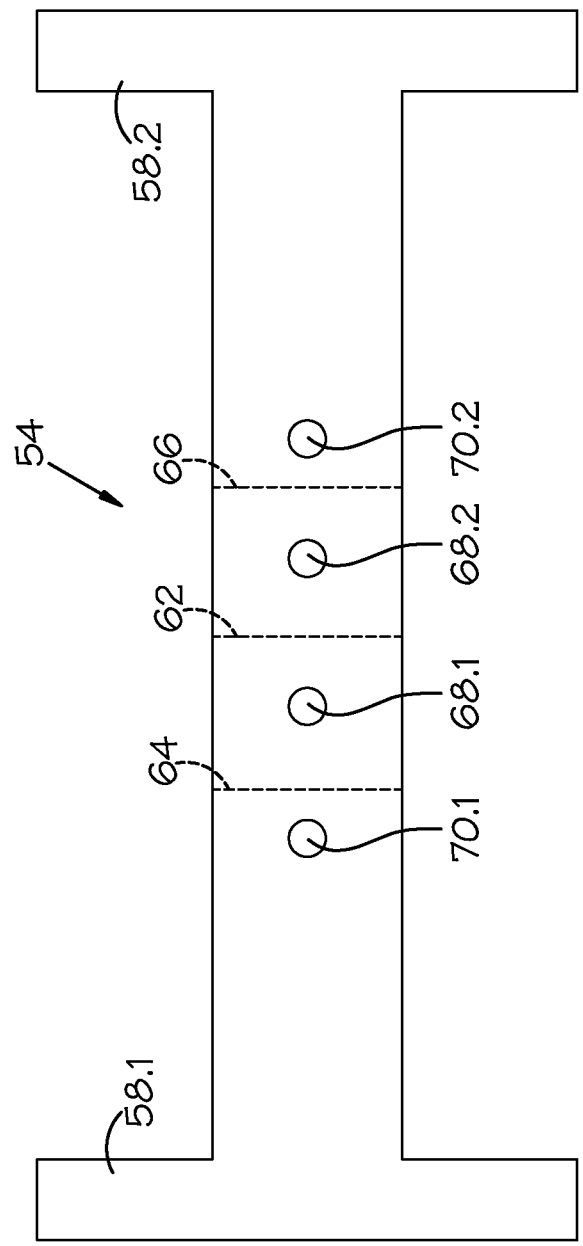
FIG. 5 shows a flattened version of a metal plate for use in the capacitive potential divider arrangement shown in FIG. 4.

A flattened version of the metal plate 54, prior to shaping the metal plate 54 for fitment onto the insulator body 38, is shown in FIG. 5. The flattened metal plate 54 comprises end portions 58.1 and 58.2. A connecting strip 60 extends between these end portions 58.1, 58.2, with a fold line 62 being defined (or definable) midway along the connecting strip 60; fold lines 64, 66 being defined (or definable) on either side of the connecting strip 60. Apertures 68.1, 68.2 are defined in the connecting strip 60, on either side of the fold line 62, and apertures 70.1 and 70.2 are defined in each end portion 58.1 and 58.2, respectively. The apertures 68.1, 68.2, 70.1 and 70.2 are sized to accommodate the clamping bolt 50.

In use, the connecting strip 60 of the plate 54 is folded along line 62, and inserted into the gap 48 defined between the spaced apart pair of arms 46. The wire 14 is positioned between the folded connecting strip 60, proximate the fold line 62, as best shown in the detailed cross-sectional view shown in FIG. 4. The apertures 68.1 and 68.2 are aligned with each other and arranged to be in line with apertures defined in the arms 46 (for accommodating the clamping nut and bolt arrangement 50).

All four apertures, 68.1, 68.2, 70.1 and 70.2, are aligned once plate 54 is bent to accommodate the clamping nut and bolt arrangement 50.

Each of the end portions 58.1 and 58.2 are wrapped over and around a respective arm 46. Again, the apertures 70.1 and 70.2 are aligned with each other and arranged to be in line with the apertures defined in the arms 46 for accommodating the clamping nut and bolt arrangement 50, which can be used to clamp the arms 46 together, thus securing the fence wire 14, and folded plate 60, in place.

A portion of the fence wire 14, and thus the end portions 58.1, 58.2 of the metal plate 54 may be considered to be one plate of a capacitor. The insulator body 38, which is typically made from a plastic material, and in which the PCB 37 is housed, may be considered to be the dielectric material of the capacitor. A track, or a copper pad, on the PCB 37 may be considered to be the second plate of the capacitor. A metallic ring 66 may be electrically connected to the track or pad on the PCB 37 to increase the capacitance.

This thus forms a first capacitor with the fence wire 14, which is clamped in close proximity. A second capacitor of known value is connected to the first capacitor and to the ground reference of the sensor 10. The ground reference of the sensor 10 would be referenced to the ground of the pulse generator, or energizer, for exciting the electric fence and taut-wires. The two capacitors thus form a capacitive potential divider. The junction point of the capacitors would also be monitored by an analogue to digital converter, with the potential at this junction point being proportional to the fence voltage.

Each taut-wire sensor along the fence now monitors both the fence potential and any mechanical movement. The information relating to mechanical movement is communicated back to some central controller. The additional costs incurred of adding fence voltage monitoring, at each sensor, is very little. However, the security is enhanced, because far more information pertaining to the fence is obtained.

The combination of taut-wire sensors and voltage and/or current sensors into a single integrated sensor results in significant hardware and installation cost savings.

The invention claimed is:

1. A sensor for an electric fence barrier system, the electric fence barrier system comprising a fence energizer and at least one electric fence wire connected to the energizer, the energizer generating high-voltage electrical pulses that can be conducted by the electrical fence wire, the sensor comprising:
   a mechanical sensing component to measure deflection of the electric fence wire to which the sensor has been fitted, and to produce a corresponding electrical deflection signal;
   an electrical activity monitoring component to measure the electrical activity arising from the generated high-voltage electrical pulses conducted by the electric fence wire to which the sensor has been fitted, and to produce an electrical activity signal;
   a controller to receive and process the electrical deflection signal and the electrical activity signal, and to generate an alarm if either or both of the measured deflection or the electric activity exceeds predetermined values; and
   wherein the sensor is securable to a post of the electric fence barrier system and is arranged to support the electric fence wire.

2. The sensor of claim 1 which further includes an insulator body to encapsulate the mechanical sensing component, the electrical activity monitoring component and the controller, so as to define an integrated sensor.

3. The sensor of claim 1, wherein the mechanical sensing component comprises a taut-wire sensor including a strain gauge sensor, an amplifier and a microprocessor to detect if an abnormal deflection of the electric fence wire has taken place.

4. The sensor of claim 1, wherein the electrical activity monitoring component comprises a device to measure the electrical potential of and/or current flow through the electric fence wire to which the sensor is attached, to detect any alteration of the electric fence circuit, resulting in different potentials along the fence circuit and/or current paths through the fence wires.

5. The sensor of claim 4, wherein the electrical activity monitoring component is fitted proximate the connection point between the electric fence wire and the sensor, with the device to measure the electrical potential being implementable using any one of the following methods: resistor divider, capacitive divider, and current measurement through a known resistor.

6. The sensor of claim 4, wherein the electrical activity monitoring component is fitted proximate the connection point between the electric fence wire and the sensor, with the device to measure the electrical current flowing in the wire being implementable using any one of the following ways: voltage drop across a known resistor, current induced into the secondary winding of a current transformer, or using a Hall effect sensor.

7. The sensor of claim 2, wherein the sensor includes a communications module also encapsulated within said insulator body to transmit the alarm and/or other data to a remote station, using a wired arrangement or a wireless arrangement, and/or to receive requests or instructions from the remote station.

8. The sensor of claim 7, wherein each sensor has a unique identifier to enable the location of the alarm, or measured mechanical and electrical parameters at that sensor, to be made known.

9. The sensor of claim 2, wherein the insulator body is arranged to support the electric fence wire, the insulator body being securable to a post of the electric fence barrier system, and the insulator body comprises a flange at a proximal end of the body, which can abut against the fence post, with a stub portion extending from the flange into the fence post.

10. The sensor of claim 9, wherein a distal end of the insulator body includes a spaced apart pair of arms that define a gap for accommodating the fence wire, with a clamping arrangement being provided to clamp the arms.

11. The sensor of claim 9, wherein the mechanical sensing component is arranged to detect any movement of the sensor relative to the fence post.

12. The sensor of claim 9, wherein the electrical activity monitoring component comprises a capacitive potential divider arrangement for measuring the electrical activity on the electric fence wire, with a metal plate being fittable over the distal end of the insulator body, proximate the fence wire.

13. The sensor of claim 12, wherein the metal plate comprises end portions with a connecting strip extending between the end portions, so that in use the connecting strip can accommodate the fence wire and the end portions can be wrapped around the end of the insulator body.

14. The sensor of claim 13, wherein the end portions of the metal plate define one plate of a first capacitor, the insulator body defines a dielectric layer, and a track on a PCB within the insulator body and/or a metallic ring around the PCB defines an opposite plate of the capacitor.

15. The sensor of claim 14, wherein a second capacitor of known value is connected to the first capacitor and to a ground reference of the sensor, the ground reference of the sensor being referenced to the ground of a pulse generator of the electric fence barrier system, to define the capacitive potential divider arrangement.

* * * * *